United States Patent
Kando

(10) Patent No.: US 7,642,694 B2
(45) Date of Patent: Jan. 5, 2010

(54) BOUNDARY ACOUSTIC WAVE DEVICE

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/397,410

(22) Filed: Mar. 4, 2009

(65) Prior Publication Data

US 2009/0152993 A1  Jun. 18, 2009

Related U.S. Application Data

(63) Continuation of application No. PCT/JP2007/066632, filed on Aug. 28, 2007.

(30) Foreign Application Priority Data

Sep. 21, 2006 (JP) ............................. 2006-255896

(51) Int. Cl.
    *H03H 9/145* (2006.01)
(52) U.S. Cl. .................. 310/313 R; 333/189
(58) Field of Classification Search ............... 310/313; 333/187–195
    See application file for complete search history.

(56) References Cited

U.S. PATENT DOCUMENTS

| 5,923,231 | A  |    | 7/1999  | Ohkubo et al. |          |
|-----------|----|----|---------|---------------|----------|
| 6,441,539 | B1 |    | 8/2002  | Kitamura et al. |        |
| 6,737,941 | B1 |    | 5/2004  | Tournois      |          |
| 7,310,027 | B2 | *  | 12/2007 | Kando ......................... | 333/133 |
| 7,322,093 | B2 | *  | 1/2008  | Kadota et al. ................. | 29/594 |
| 7,355,319 | B2 | *  | 4/2008  | Kando ..................... | 310/313 A |
| 7,453,184 | B2 | *  | 11/2008 | Kando ..................... | 310/313 R |
| 7,456,544 | B2 | *  | 11/2008 | Kando ..................... | 310/313 R |
| 7,486,001 | B2 | *  | 2/2009  | Kando ..................... | 310/313 R |
| 7,489,064 | B2 | *  | 2/2009  | Kando ..................... | 310/313 A |
| 7,554,428 | B2 | *  | 6/2009  | Yamamoto et al. .......... | 333/193 |
| 7,564,174 | B2 | *  | 7/2009  | Matsuda et al. ............. | 310/346 |
| 7,573,178 | B2 | *  | 8/2009  | Inoue et al. ............. | 310/313 R |
| 7,581,306 | B2 | *  | 9/2009  | Kadota et al. ................. | 29/594 |

(Continued)

FOREIGN PATENT DOCUMENTS

JP   55133118 A  * 10/1980

(Continued)

OTHER PUBLICATIONS

Official Communication issued in International Patent Application No. PCT/JP2007/066632, mailed on Nov. 27, 2007.

(Continued)

*Primary Examiner*—J. SanMartin
(74) *Attorney, Agent, or Firm*—Keating & Bennett, LLP

(57) ABSTRACT

A boundary acoustic wave device includes a stacked structure including a second medium, an IDT electrode, and a first medium, the stacked structure including the first medium having a temperature coefficient of group delay time TCD that is positive. The IDT electrode is stacked on the first medium. The second medium is stacked on the first medium so as to cover the IDT electrode and has a temperature coefficient of group delay time TCD that is negative. A third medium having an acoustic velocity of a transverse wave that is less than an acoustic velocity of a transverse wave of the second medium is arranged at least on a top surface of the IDT electrode.

4 Claims, 5 Drawing Sheets

U.S. PATENT DOCUMENTS

| | | |
|---|---|---|
| 2006/0071579 A1 | 4/2006 | Kando |
| 2006/0273687 A1* | 12/2006 | Fujimoto et al. ......... 310/313 R |
| 2007/0210676 A1* | 9/2007 | Matsuda et al. ............. 310/326 |
| 2007/0241841 A1* | 10/2007 | Hauser et al. ................ 333/193 |
| 2008/0129418 A1* | 6/2008 | Miura et al. ................. 333/195 |
| 2008/0266024 A1* | 10/2008 | Ruile et al. ................. 333/147 |
| 2009/0058225 A1* | 3/2009 | Kadota .................... 310/313 B |
| 2009/0066189 A1* | 3/2009 | Kando ........................ 310/346 |
| 2009/0102318 A1* | 4/2009 | Kando .................... 310/313 R |
| 2009/0201102 A1* | 8/2009 | Oda ........................... 333/193 |
| 2009/0212659 A1* | 8/2009 | Matsuda et al. ......... 310/313 D |

FOREIGN PATENT DOCUMENTS

| | | |
|---|---|---|
| JP | 61-117913 A | 6/1986 |
| JP | 04-288718 A | 10/1992 |
| JP | 10-117122 A | 5/1998 |
| JP | 2001-211053 A | 8/2001 |
| JP | 2003-512637 A | 4/2003 |
| JP | 2004-260625 A | 9/2004 |
| JP | 2008078739 A * | 4/2008 |
| JP | 2008109413 A * | 5/2008 |
| JP | 2008118576 A * | 5/2008 |
| WO | 96/04713 A1 | 2/1996 |
| WO | 98/52279 A1 | 11/1998 |
| WO | 2004/070946 A1 | 8/2004 |
| WO | WO 2007138840 A1 * | 12/2007 |
| WO | WO 2007138844 A1 * | 12/2007 |

OTHER PUBLICATIONS

Mitobe et al.: "Finite-Element Analysis of Periodically Perturbed Piezoelectric Waveguides," Transactions of Institute of Electronics and Communication Engineers of Japan; vol. J68-C, No. 1; Jan. 1985; pp. 21-27.

* cited by examiner

BOUNDARY ACOUSTIC WAVE DEVICE

BACKGROUND OF THE INVENTION

1. Field of the Invention

The present invention relates to boundary acoustic wave devices which are used for resonators and band-pass filters. In particular, the present invention relates to a boundary acoustic wave device that includes an IDT electrode provided between a first medium and a second medium and utilizes boundary acoustic waves propagating along the boundary between the first medium and the second medium.

2. Description of the Related Art

Surface acoustic wave devices have been widely used as resonators and band-pass filters. Recently, instead of such surface acoustic wave devices, boundary acoustic wave devices that enable package size reduction have been attracting attention.

For example, WO2004/070946 discloses a boundary acoustic wave device having a configuration as shown in FIG. 9. A boundary acoustic wave device 101 includes a first medium 102 and a second medium 103 that are stacked together. The first medium 102 is made of a LiNbO$_3$ substrate and the second medium 103 is made of SiO$_2$. Additionally, an IDT 104 made of Au is disposed at the boundary between the first medium 102 and the second medium 103.

Since the IDT 104 is made of the metal having a high density and a low acoustic wave velocity, vibrational energy is concentrated at a portion at which the IDT 104 is disposed, that is, at the boundary between the first medium 102 and the second medium 103. As a result, a boundary acoustic wave is excited.

Unfortunately, the boundary acoustic wave device 101 described in WO2004/070946 has a problem in temperature properties, that is, the boundary acoustic wave device 101 has a relatively large absolute value of a temperature coefficient of group delay time TCD. This problem will be specifically described. As disclosed in WO2004/070946, the boundary acoustic wave device 101 has a configuration in which the first medium 102 is made of a 15° Y-cut X-propagation LiNbO$_3$ substrate and has a thickness of 8λ, the second medium 103 is made of SiO$_2$ and has a thickness of 8λ, and the IDT electrode 104 is made an Au film having a thickness of 0.05λ and an Al film having a thickness of 0.05λ that are stacked on the Au film, and the boundary acoustic wave device 101 has a duty of 0.5. The temperature coefficient of group delay time TCD of this configuration was calculated.

The calculation was conducted by extending the finite element method described in "Finite-Element Analysis of Periodically Perturbed Piezoelectric Waveguides" (The Institute of Electronics and Communication Engineers Transactions, Vol. J68-C, No1, 1985/1, pp. 21-27). Specifically, one strip is disposed within an interval of a half wavelength and acoustic wave velocities at the upper end of a stop band and at the lower end of the stop band were determined in the open-circuited strip and in the short-circuited strip. The acoustic wave velocity at the lower end in the open-circuited strip is represented by $V_{O1}$. The acoustic wave velocity at the upper end in the open-circuited strip is represented by $V_{O2}$. The acoustic wave velocity at the lower end in the short-circuited strip is represented by $V_{S1}$. The acoustic wave velocity at the upper end in the short-circuited strip is represented by $V_{S2}$. The vibration of boundary acoustic wave is propagated such that most of the vibrational energy is concentrated in the range from a position above the IDT by 1λ to a position below the IDT by 1λ. For this reason, an analysis region was defined as a region of 8λ in the vertical direction with the IDT electrode being the center of the region, that is, a region from a position above the IDT electrode by 4λ to a position below the IDT electrode by 4λ. The boundary conditions of the front surface and the back surface of the boundary acoustic wave device were elastically fixed.

Then, $\kappa_{12}/k_0$ representing the amount of reflection of boundary acoustic wave in the electrode fingers of the IDT electrode and an electromechanical coefficient $K^2$ were determined by a method described in "Evaluation of Excitation Property of Surface Acoustic Wave Interdigital Transducer By Mode Coupling Theory" The Institute of Electronics, Information and Communication Engineers Research Report, MW90-62, 1990, pp. 69-74). Compared to the configuration described in this document, the configuration used herein exhibits a larger frequency dispersion in acoustic wave velocity. For this reason, $\kappa_{12}/k_0$ was determined in consideration of the influence of the frequency dispersion.

The temperature coefficient of group delay time TCD was calculated from phase velocities $V_{15°C.}$, $V_{25°C.}$, and $V_{35°C.}$ at the lower end of the stop band of the short-circuited strip respectively at 15° C., 25° C., and 35° C.

Equation 1

$$TCD = \alpha_s - \frac{1}{V_{25°C.}} \cdot \frac{V_{35°C.} - V_{15°C.}}{20(°C.)} \qquad \text{Equation (1)}$$

In Equation (1), $\alpha_s$ represents a coefficient of linear expansion of a LiNbO$_3$ substrate in the propagation direction of boundary wave. Table 1 shows characteristics of boundary acoustic waves that propagate through the configuration described above. ΔF in Table 1 is the change in frequency calculated from acoustic wave velocity $V_{s1}$ when the duty is changed by +0.01.

TABLE 1

| Item | Propagation properties |
| --- | --- |
| Type of boundary wave | SH boundary wave mainly composed of SH component |
| Acoustic wave velocity $V_{s1}$ | 3221 m/s |
| TCD | 42.1 ppm/° C. |
| $K^2$ | 16.0% |
| $\kappa_{12}/k_0$ | 0.15 |
| ΔF | −2499 ppm |

As shown in Table 1, the existing boundary acoustic wave device has a very large $\kappa_{12}/k_0$ of 0.15. This may result in a very large change in frequency ΔF of −2499 ppm.

Table 1 also shows that the boundary acoustic wave device has a large temperature coefficient of group delay time TCD of 42.1 ppm/° C.

In summary, a boundary acoustic wave device in which an IDT electrode made of Au is used and the energy of the boundary acoustic wave is confined at the interface between the first medium and the second medium exhibits a deteriorated temperature coefficient of group delay time TCD.

SUMMARY OF THE INVENTION

To overcome the problems described above, preferred embodiments of the present invention provide a boundary acoustic wave device in which an IDT electrode made of a metal having a large mass is disposed between a first medium and a second medium, and the energy of the boundary acoustic wave is confined between the first medium and the second medium, the boundary acoustic wave device having a reduced absolute value of a temperature coefficient of group delay time TCD.

A preferred embodiment of the present invention provides a boundary acoustic wave device including a stacked structure including a second medium, an IDT electrode, and a first medium, the stacked structure including the first medium having a temperature coefficient of group delay time TCD that is positive, the IDT electrode stacked on the first medium, the second medium stacked on the first medium to cover the IDT electrode and having a temperature coefficient of group delay time TCD that is negative, and a third medium arranged at least on a top surface of the IDT electrode, the third medium being made of a dielectric material of which an acoustic velocity is less than an acoustic velocity of the second medium.

In a boundary acoustic wave device according to a preferred embodiment of the present invention, the third medium is preferably configured to cover not only the top surface of the IDT electrode but also at least a portion of a side surface of the IDT electrode. This expands the energy distribution of the confined boundary acoustic wave to the second-medium side, thereby further improving the temperature properties of the boundary acoustic wave device.

In a preferred embodiment of the present invention, the third medium is preferably configured to cover the IDT electrode provided on the first medium and to cover a top surface of the first medium. In this case, the third medium can be readily and accurately formed by a thin-film formation method after the IDT electrode is formed on the first medium.

Preferably, the IDT electrode includes a plurality of metal layers that are stacked together and one of the metal layers provided at a second-medium-side end of the metal layers is made of a metal lighter than a metal or metals defining a remaining metal layers. When the metal layer provided on the second-medium-side end of the metal layers is made of a lighter metal, the temperature properties of the boundary acoustic wave device can be more effectively improved.

A boundary acoustic wave device according to a preferred embodiment of the present invention includes a first medium having a temperature coefficient of group delay time TCD that is positive and a second medium having a temperature coefficient of group delay time TCD that is negative. With this configuration, the temperature coefficients of group delay time TCDs of the first medium and the second medium cancel each other out, thereby decreasing the absolute value of the temperature coefficient of group delay time TCD of the boundary acoustic wave device. In a configuration in which an IDT electrode is provided on a first medium and a second medium is stacked on the first medium to cover the IDT electrode, the mass load of the IDT electrode tends to increase the absolute value of the temperature coefficient of group delay time TCD of the configuration.

However, in a preferred embodiment of the present invention, the third medium having a lower acoustic wave velocity than the second medium is provided at least on the top surface of the IDT electrode. This expands the energy distribution of boundary acoustic wave to the second medium side, the second medium having a negative TCD. As a result, temperature properties of the boundary acoustic wave device can be improved, and in particular, the absolute value of the TCD can be decreased.

According to various preferred embodiments of the present invention, even when a boundary acoustic wave device includes an IDT electrode that is made of a metal having a high density such as Au, the boundary acoustic wave device exhibits improved temperature properties. In particular, the absolute value of the TCD of the boundary acoustic wave device can be effectively decreased.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the present invention will be disclosed by specifically describing preferred embodiments of the present invention with reference to the drawings.

Figure 1:
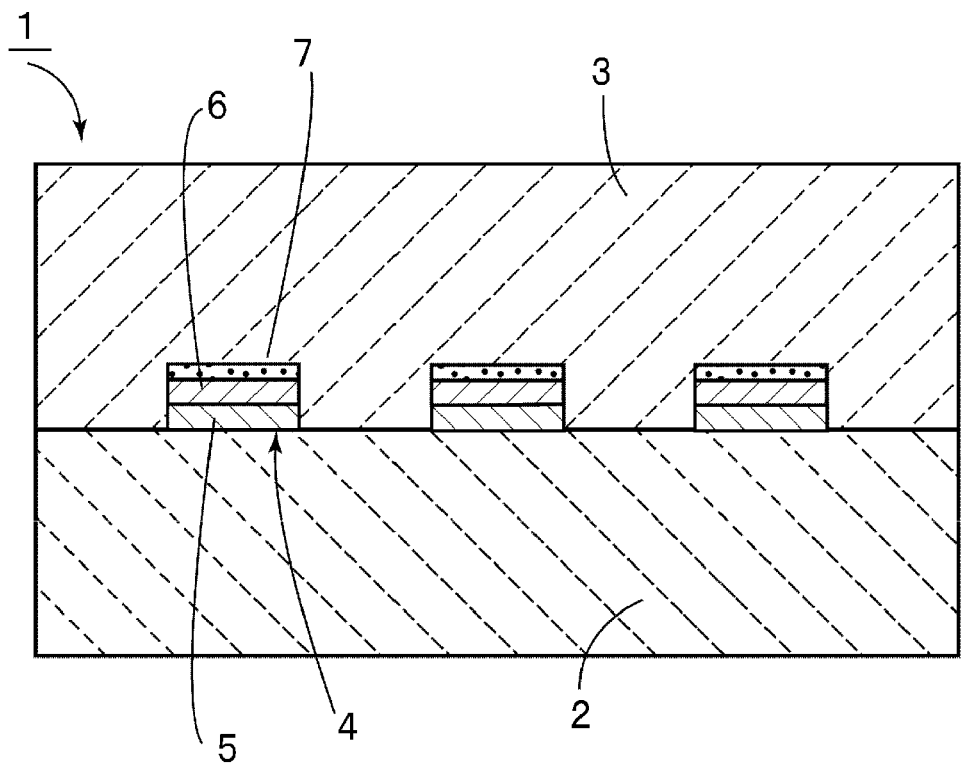
FIG. 1 is a front sectional view showing a main portion of a boundary acoustic wave device according to a preferred embodiment of the present invention.

FIG. 1 is a schematic front sectional view showing a main portion of a boundary acoustic wave device according to a first preferred embodiment of the present invention.

A boundary acoustic wave device 1 includes a first medium 2 and a second medium 3 stacked on the first medium 2. The first medium 2 is made of a material having a temperature coefficient of group delay time TCD that is positive. In the present preferred embodiment, the first medium 2 is preferably made of 15° Y-cut X-propagation $LiNbO_3$, for example. The second medium 3 is made of an appropriate dielectric material having a temperature coefficient of group delay time TCD that is negative or an appropriate insulating material having a temperature coefficient of group delay time TCD that is negative. In the present preferred embodiment, the second medium 3 is preferably made of $SiO_2$, for example. An acoustic velocity of a transverse wave of the $SiO_2$ defining the second medium is about 3757 m/s. An acoustic velocity of a transverse wave of $Ta_2O_5$ defining a third medium 7 described below is about 1580 m/s.

An IDT electrode 4 is provided on the first medium 2. The IDT electrode 4 includes a plurality of electrode fingers.

In the present preferred embodiment, the IDT electrode 4 preferably includes a first metal layer 5 stacked on the first medium 2 and a second metal layer 6 stacked on the first metal layer 5, for example. That is, the IDT electrode 4 includes a plurality of metal layers stacked together. The first metal layer 5 is preferably made of Au, for example. The second metal layer 6 is preferably made of Al, for example. That is, the metal layer 6, which is at the second-medium-3-side end of the metal layers 5 and 6, is preferably made of a metal that is lighter than a metal defining the other metal layer 5.

In the present preferred embodiment, the third medium 7 is configured to cover the top surface of the IDT electrode 4. The third medium 7 is preferably made of a material in which an acoustic velocity of a transverse wave is less than an acoustic velocity of a transverse wave of the second medium 3. In the present preferred embodiment, the third medium 7 is preferably made of $Ta_2O_5$, for example.

Figure 2:
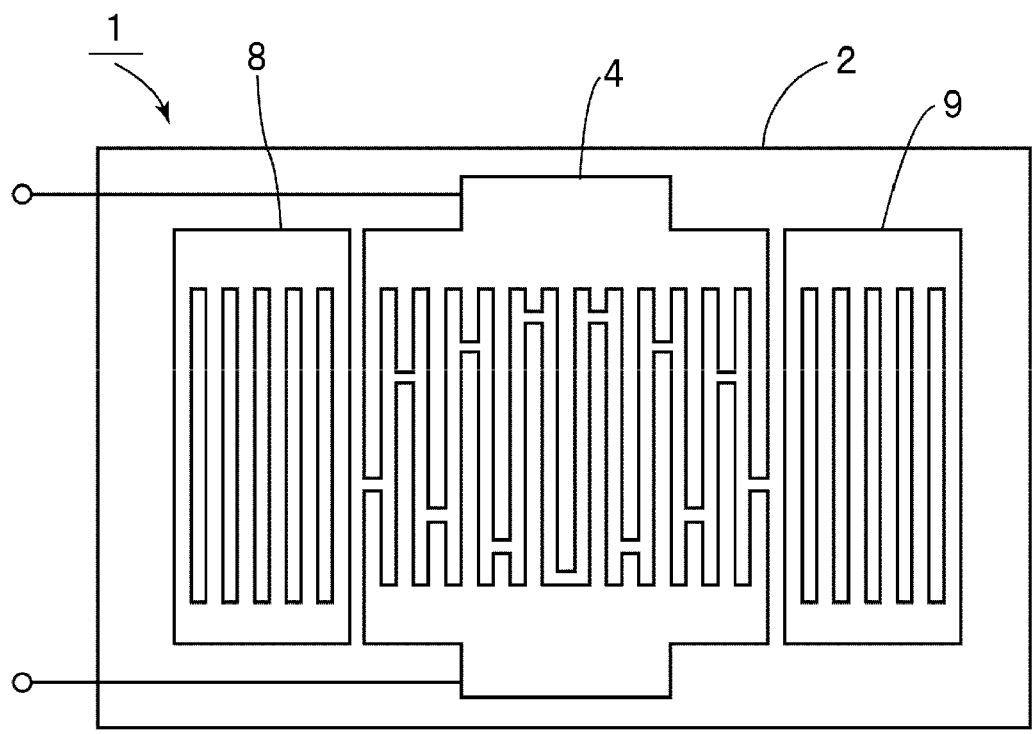
FIG. 2 is a schematic plan view showing the electrode configuration of the boundary acoustic wave device of the preferred embodiment shown in FIG. 1.

The electrode configuration of the boundary acoustic wave device 1 including the IDT electrode 4 is not particularly restricted. As shown in the schematic plan view of FIG. 2, the electrode configuration in the present preferred embodiment defines a one-port boundary acoustic wave resonator in which reflectors 8 and 9 are provided on both sides of the IDT electrode 4 in the propagation direction of boundary acoustic wave.

In the boundary acoustic wave device 1 of the present preferred embodiment, the first medium 2 has a temperature coefficient of group delay time TCD that is positive and the second medium 3 has a temperature coefficient of group delay time TCD that is negative. With this configuration, the temperature properties of the first medium 2 and the second medium 3 cancel each other out, thereby decreasing the absolute value of the temperature coefficient of group delay time TCD of the boundary acoustic wave device 1.

However, this does not sufficiently improve the temperature coefficient of group delay time TCD of the boundary acoustic wave device 1. This is probably because the IDT electrode 4 includes a heavy metal layer made of Au in order to confine the energy of boundary acoustic wave at the interface between the first medium 2 and the second medium 3.

Figure 3:
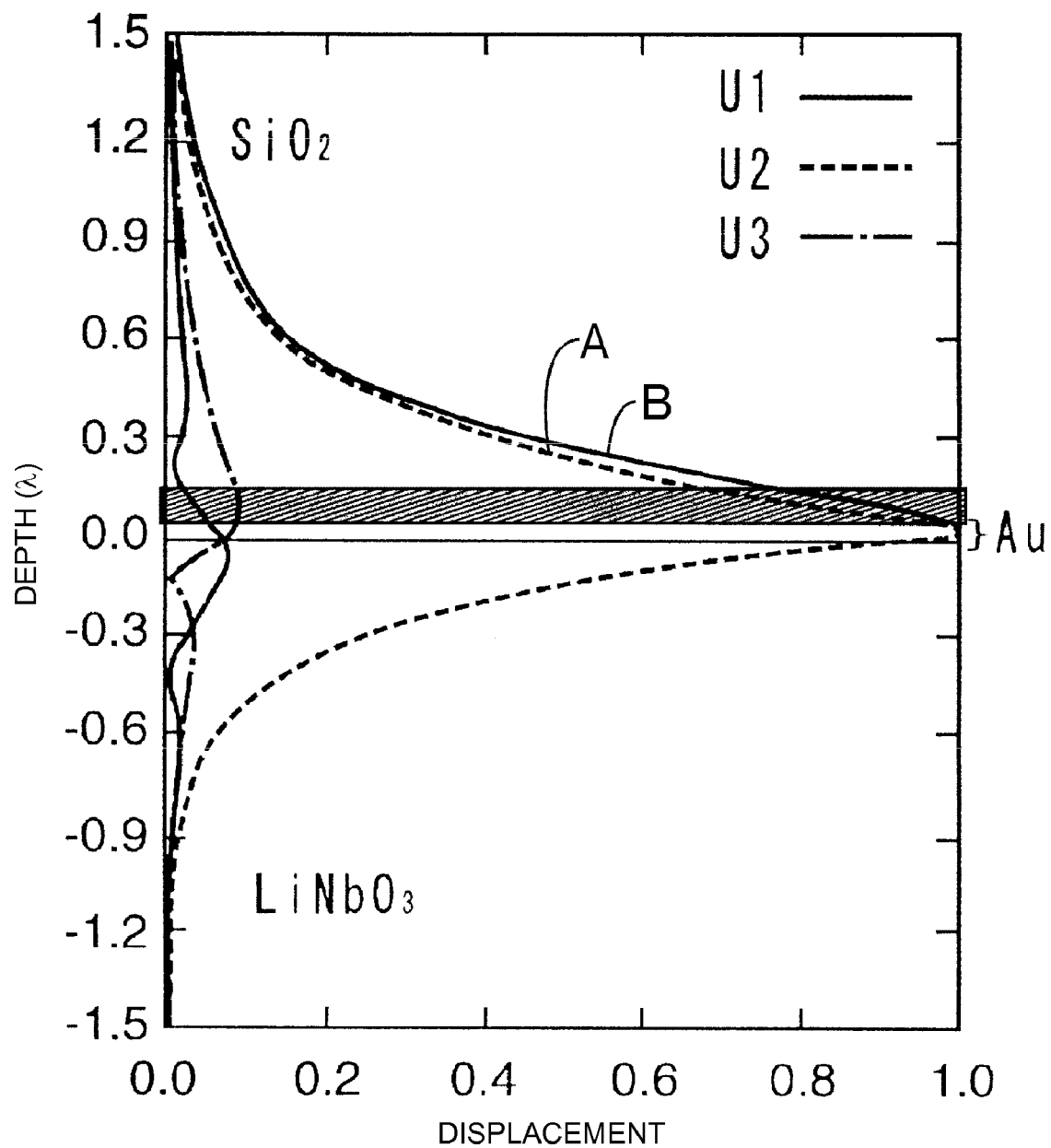
FIG. 3 is a schematic view showing that the formation of a third medium changes the energy distribution of boundary acoustic wave.

However, in the present preferred embodiment, the temperature coefficient of group delay time TCD can be effectively improved by providing the third medium 7 configured to cover the top surface of the IDT electrode 4, that is, on the side of the second medium 3. FIG. 3 schematically shows the energy distribution of a boundary acoustic wave in the boundary acoustic wave device 1. When the third medium 7 is not provided, the energy distribution of confined boundary acoustic wave U2 at the level above the Au metal layer of the IDT electrode 4 is represented by a broken line A. In contrast, when the third medium 7 is provided, the energy distribution expands to the second-medium-3 side as shown by a solid line B.

Hereinafter, the fact that the boundary acoustic wave device 1 of the preferred embodiment described above exhibits an improved temperature coefficient of group delay time TCD is more specifically described with reference to an example.

The boundary acoustic wave device 1 was designed to have a configuration summarized in Table 2 below. Calculations regarding the boundary acoustic wave device 1 were performed similarly to those performed on the existing boundary acoustic wave device 101 described above.

TABLE 2

| Configuration | $SiO_2/Ta_2O_5/IDT/15°$ Y-X $LiNbO_3$ |
|---|---|
| IDT (Al/Au) | Thickness: 0.05/0.05λ, Duty: 0.5 |

TABLE 2-continued

| Third medium ($Ta_2O_5$) | Thickness is plotted along each abscissa in FIGS. 4 to 7. |
|---|---|
| Second medium ($SiO_2$) | Thickness: 8λ |
| First medium (15° Y-X $LiNbO_3$) | Thickness: 8λ |

Specifically, acoustic wave velocities at the upper end of a stop band and the lower end of the stop band in an open-circuited strip of the IDT electrode and in a short-circuited strip of the IDT electrode, $\kappa_{12}/k_0$ representing the amount of reflection of boundary wave in the electrode fingers of the IDT electrode 4, an electromechanical coefficient $K^2$, and a temperature coefficient of group delay time TCD were determined by the calculation methods used for the existing boundary acoustic wave device 101. The TCD was calculated with Equation (1) described above.

Figure 4:
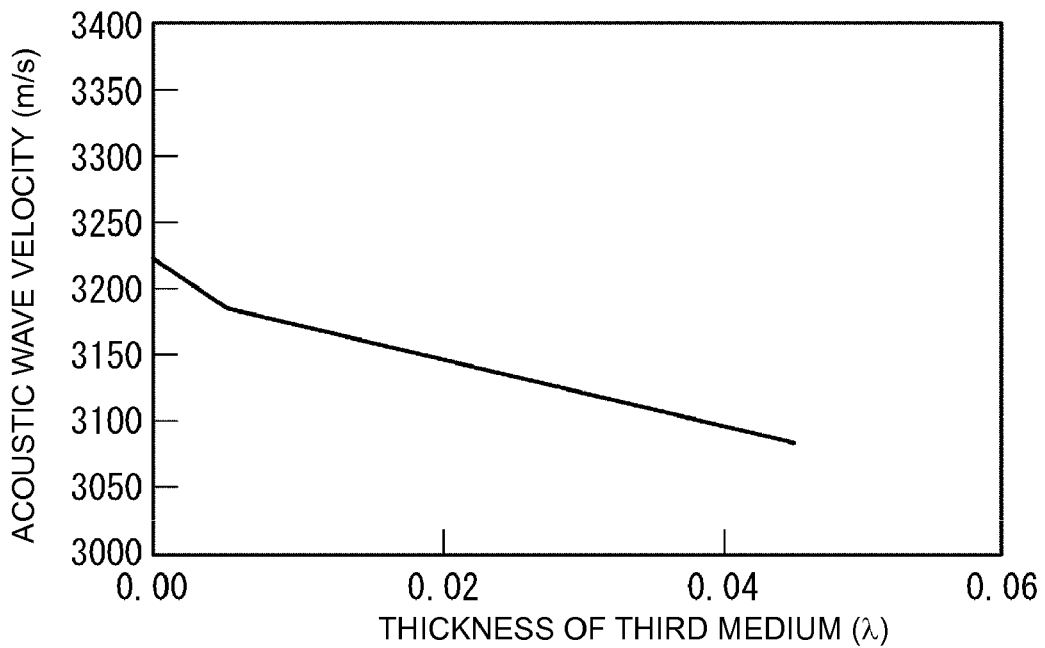
FIG. 4 is a graph showing changes in the velocity of the boundary acoustic wave at the lower end of a stop band when the thickness of a third medium is changed.
Figure 5:
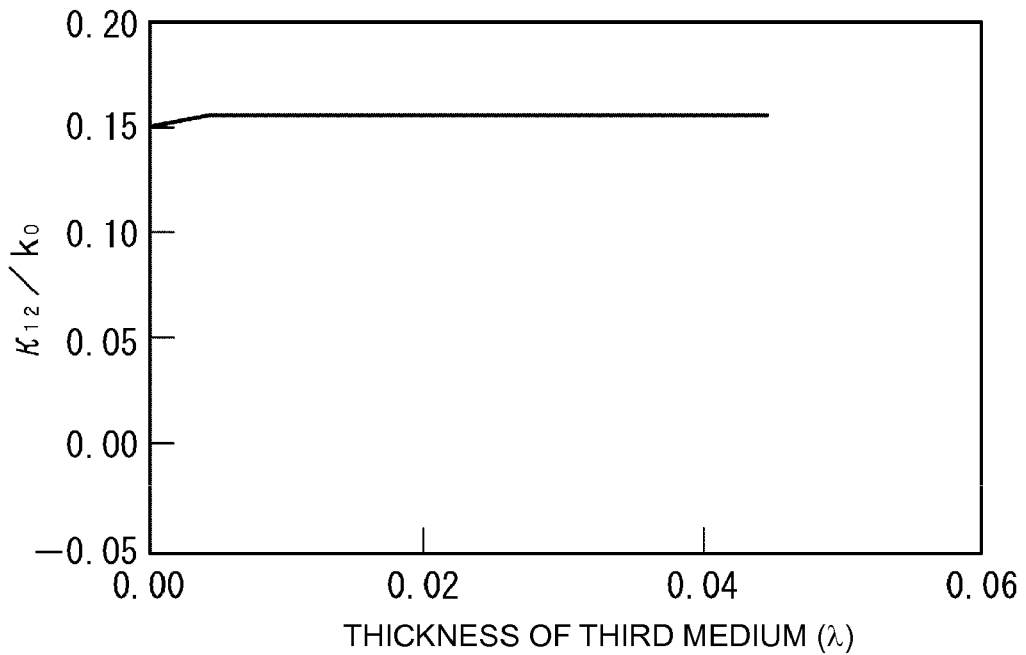
FIG. 5 is a graph showing changes in $\kappa_{12}/k_0$ when the thickness of a third medium is changed.
Figure 6:
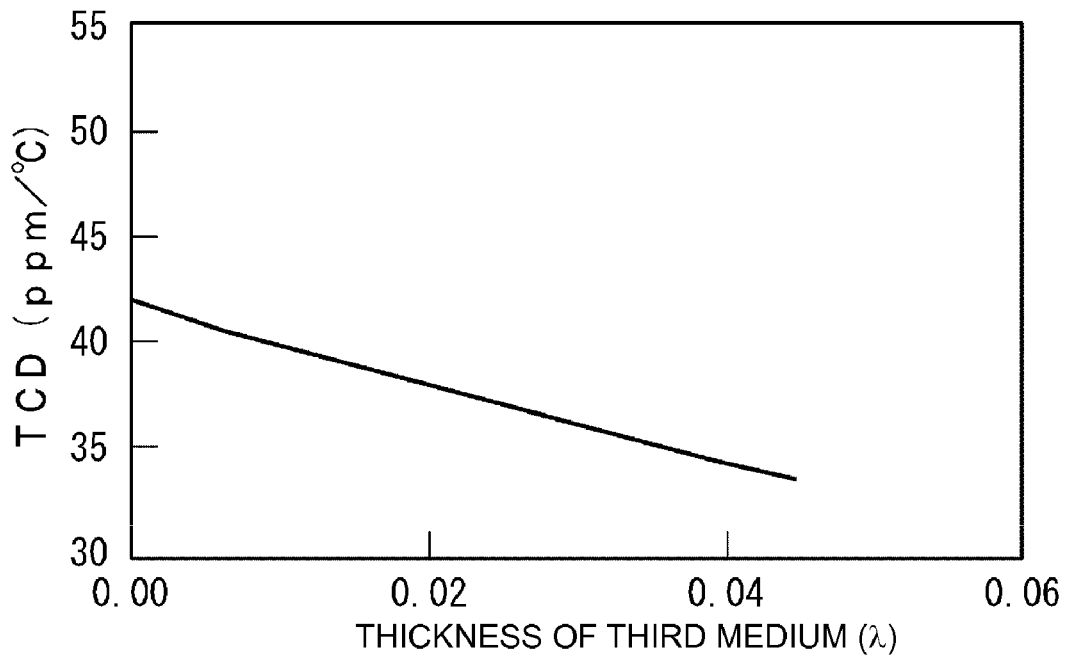
FIG. 6 is a graph showing changes in a temperature coefficient of group delay time TCD when the film thickness of a third medium is changed.
Figure 7:
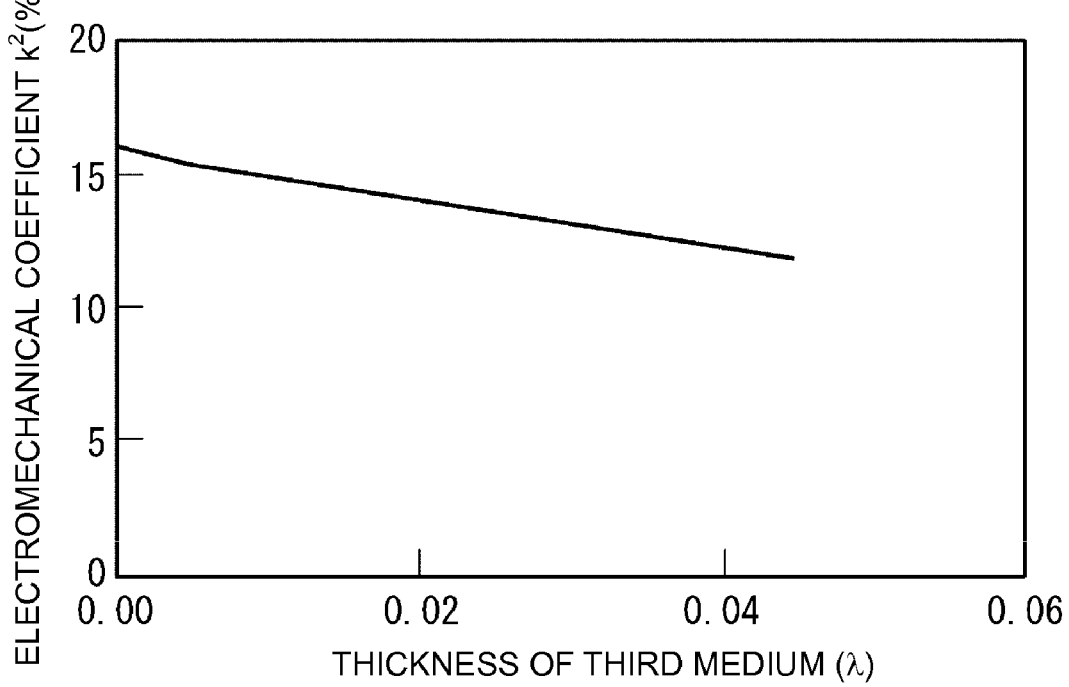
FIG. 7 is a graph showing changes in the electromechanical coefficient $K^2$ of boundary acoustic wave when the film thickness of a third medium is changed.

The calculation results are shown in FIGS. 4 to 7. FIG. 4 shows the relationship between the thickness of the third medium and the acoustic wave velocity $V_{s1}$ at the lower end of the stop band. FIG. 5 shows the relationship between the thickness of the third medium and $\kappa_{12}/k_0$. FIG. 6 shows the relationship between the thickness of the third medium and the temperature coefficient of group delay time TCD. FIG. 7 shows the relationship between the thickness of the third medium and the electromechanical coefficient $K^2$.

As shown in FIG. 7, as the thickness of the third medium increases, the electromechanical coefficient $K^2$ of boundary acoustic wave slightly decreases. However, as shown in FIG. 6, as the thickness of the third medium increases, the absolute value of the temperature coefficient of group delay time TCD decreases to a sufficiently low level. As shown in FIGS. 4 and 5, as the thickness of the third medium increases, the acoustic wave velocity decreases whereas $\kappa_{12}/k_0$ changes negligibly.

A piezoelectric material used as the first medium in a typical boundary acoustic wave device often has a temperature coefficient of group delay time TCD that is positive. In such a boundary acoustic wave device, the absolute value of the temperature coefficient of group delay time TCD can be decreased by providing the second medium made of a material having a temperature coefficient of group delay time TCD that is negative, as described in the boundary acoustic wave device 101 of WO2004/070946. However, this method cannot sufficiently decrease the absolute value of the temperature coefficient of group delay time TCD. This is presumably because, in a configuration in which the energy of boundary acoustic wave is confined at the interface between the first medium and the second medium by providing the IDT electrode made of a metal having a large mass, such as Au, for example, the mass load of the IDT electrode degrades the temperature properties of the boundary acoustic wave device.

In contrast, the present preferred embodiment exhibits improved temperature properties probably because the third medium having a low acoustic wave velocity that is arranged to cover the top surface of the IDT electrode expands the energy distribution of boundary acoustic wave from the interface between the media to the second-medium side as shown in FIG. 3.

According to the present preferred embodiment, the third medium 7 effectively improves the temperature properties of resonant frequency.

Figure 8:
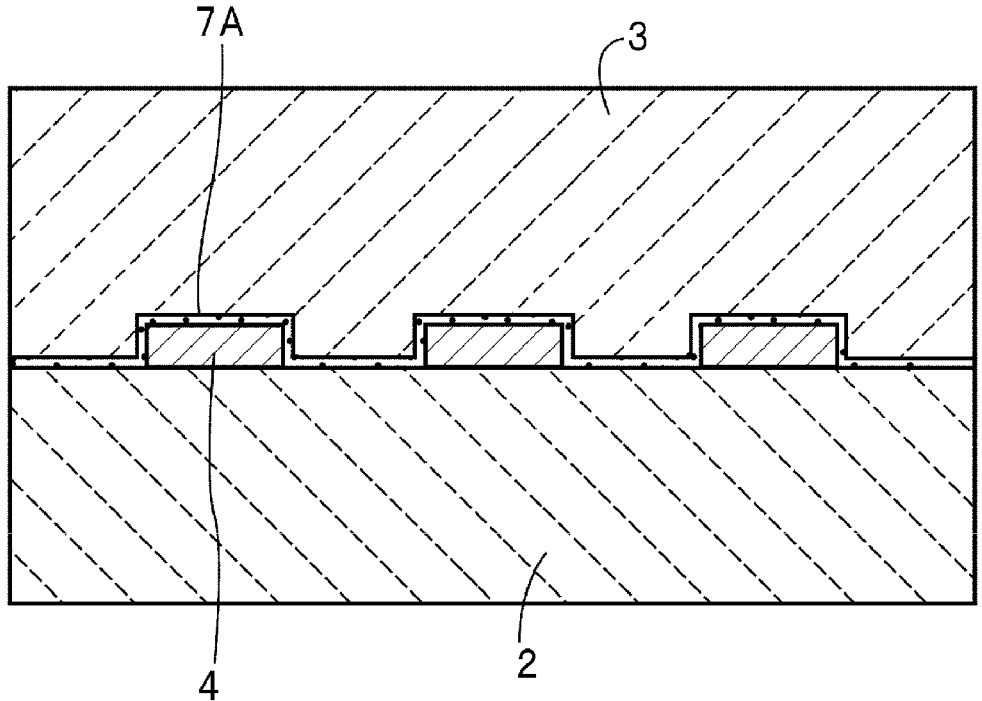
FIG. 8 is a schematic front sectional view showing a main portion of a boundary acoustic wave device according to a modification of the first preferred embodiment of the present invention.
Figure 9:
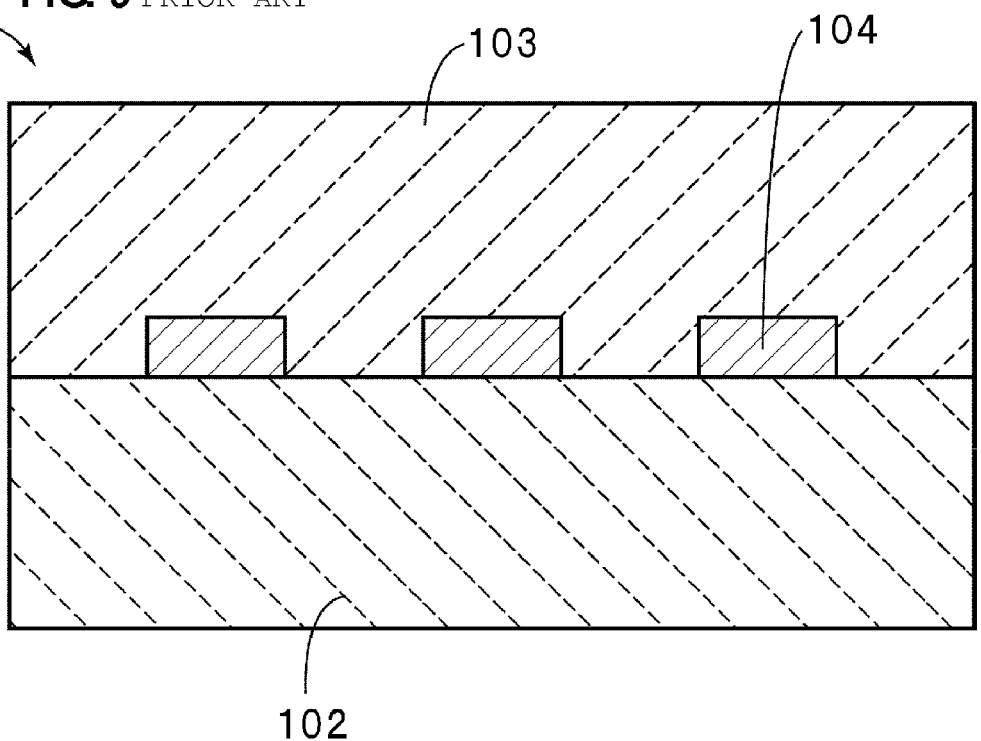
FIG. 9 is a schematic front sectional view for describing a known boundary acoustic wave device.

In the present preferred embodiment, the third medium 7 is arranged on the top surface of the IDT electrode 4. Alternatively, as in a modification of the preferred embodiment shown in FIG. 8, a third medium 7A may be arranged to cover not only the top surface of the IDT electrode 4 but also at least a portion of a side surface of the IDT electrode 4. In this case, as shown in FIG. 8, the third medium 7A is preferably arranged to cover the IDT electrode 4 provided on the first medium 2 and to cover the top surface of the first medium 2. The third medium 7A can be readily formed by a thin-film formation method after the IDT electrode 4 is provided on the first medium 2.

As shown in FIG. 8, the IDT electrode 4 may preferably be defined by a single metal layer.

A metal material defining the IDT electrode is not particularly restricted. The metal preferably has a mass that is greater than Al in order to effectively confine the energy of boundary acoustic wave at the interface between the media. Examples of such a metal may include Au, Pt, Ag, Cu, Ni, Ti, Fe, W, Ta and alloys primarily including the foregoing metals.

Alternatively, as in the preferred embodiment shown in FIG. 1, the IDT electrode 4 may preferably include a plurality of metal layers stacked together. In this case, the IDT electrode 4 preferably includes metal layers made of metals or alloys that are heavier than Al as described above. Alternatively, the IDT electrode 4 may preferably include a first metal layer made of a metal or an alloy that is heavier than Al and a second metal layer made of a metal, such as Al having a lighter mass than the metal material defining the first metal layer, the second metal layer being stacked on the first metal layer. Alternatively, the IDT electrode 4 may preferably include a plurality of metal layers made of metals that are heavier than Al and stacked together.

More preferably, as in the preferred embodiment shown in FIG. 1, when the IDT electrode 4 includes a plurality of metal layers stacked together, the metal layer 6 having a smaller mass than the metal layer 5 is provided at the second-medium-3-side end of the stacked metal layers. With this configuration, the energy distribution of the boundary acoustic wave can be expanded to the second-medium-3 side, thereby further improving the temperature properties of the boundary acoustic wave device.

In the IDT electrode, for the purpose of enhancing adhesion or power handling performance of the IDT electrode, a thin layer made of a metal such as Ti, Cr, NiCr, Ni, Pt, or Pd or an alloy of the metal, for example may preferably be provided between the IDT electrode and the first medium, between the IDT electrode and the third medium, or among a plurality of metal layers defining the IDT electrode. With such a configuration, a material that determines the reflection of the boundary acoustic wave in the strips of the IDT electrode, and the velocities of transverse acoustic waves in the first medium and the second medium should be taken into consideration. The material is often the heaviest metal defining the electrode.

In the preferred embodiment and the modification of the preferred embodiment described above, the first medium is preferably made of $LiNbO_3$, the second medium is preferably made of $SiO_2$, and the third medium is preferably made of $Ta_2O_5$, for example. Alternatively, the first to the third media may preferably be made of other appropriate piezoelectric materials and dielectric materials. Examples of such materials may preferably include Si, glass, SaC, ZnO, PZT ceramics, AlN, $Al_2O_3$, $LiTaO_3$, and $KNbO_3$.

Note that one of the first medium 2 and the second medium 3 must be made of a piezoelectric material.

Alternatively, at least one of the second medium 3 and the first medium 2 may preferably be defined by layers stacked together. The second medium 3 may preferably include a $SiO_2$ layer and a SiN layer stacked on the $SiO_2$ layer.

The third medium is preferably made of a material that enhances adhesion between the third medium and the IDT, for example, $TiO_2$. The third medium is preferably made of a chemically-stable material, such as $Ta_2O_5$, for example. This suppresses an increase in the resistance of the electrode caused by diffusion of the medium into the electrode.

Additionally, a protective layer may preferably be provided on a surface of the first medium and the second medium that are stacked together, for the purpose of enhancing the strength of the boundary acoustic wave device or preventing entry of a corrosive gas into the boundary acoustic wave device. Optionally, the boundary acoustic wave device 1 may preferably be sealed in a package. A material defining the protective layer is not particularly restricted and an insulating material or a metal film may be used. Examples of the insulating material may preferably include organic insulating materials such as polyimide resins and epoxy resins, and inorganic insulating materials such as titanium oxide, aluminum nitride, and aluminum oxide. Examples of the metal film may include an Au film, an Al film, and a W film.

The present invention is applicable not only to the resonator including reflectors described above but also to devices using boundary acoustic wave, such as longitudinally coupled filters, ladder filters, longitudinally coupled resonator filters, transversely coupled resonator filters, transversal boundary acoustic wave filters using reflection type SPUDTs, boundary acoustic wave optical switches, and boundary acoustic wave optical filters.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
    a stacked structure including a second medium, an IDT electrode, and a first medium; wherein
    the first medium has a temperature coefficient of group delay time TCD that is positive;
    the IDT electrode is stacked on the first medium;
    the second medium is stacked on the first medium so as to cover the IDT electrode and having a temperature coefficient of group delay time TCD that is negative; and
    a third medium is arranged at least on a top surface of the IDT electrode, the third medium being made of a dielectric material having an acoustic velocity of a transverse wave that is less than an acoustic velocity of a transverse wave of the second medium.

2. The boundary acoustic wave device according to claim 1, wherein the third medium is arranged to cover not only the top surface of the IDT electrode but also at least a portion of a side surface of the IDT electrode.

3. The boundary acoustic wave device according to claim 2, wherein the third medium is arranged to cover the IDT electrode stacked on the first medium and to cover a top surface of the first medium.

4. The boundary acoustic wave device according to claim 1, wherein the IDT electrode includes a plurality of metal layers that are stacked together, and one of the metal layers provided at a second-medium-side end of the metal layers is made of a metal that is lighter than a metal or metals defining the remaining metal layers.

* * * * *